United States Patent [19]

Noguchi et al.

[11] Patent Number: 4,487,678
[45] Date of Patent: Dec. 11, 1984

[54] DRY-ETCHING APPARATUS

[75] Inventors: Minori Noguchi, Yokohama; Toru Otsubo, Fujisawa; Susumu Aiuchi; Takashi Kamimura, both of Yokohama; Teru Fujii, Chigasaki, all of Japan

[73] Assignee: Hitachi, Ltd., Tokyo, Japan

[21] Appl. No.: 597,749

[22] Filed: Apr. 6, 1984

[30] Foreign Application Priority Data

Apr. 6, 1983 [JP] Japan .................................. 58-59232

[51] Int. Cl.³ .............................................. C23C 15/00
[52] U.S. Cl. ................................. 204/298; 204/192 R; 204/192 E
[58] Field of Search ................. 204/298, 192 R, 192 E

[56] References Cited

U.S. PATENT DOCUMENTS

| 4,322,277 | 3/1982 | Opresko | 204/298 |
| 4,331,526 | 5/1982 | Kuehnle | 204/298 |
| 4,379,743 | 4/1983 | Nakatsukasa | 204/298 |
| 4,422,916 | 12/1983 | McKelvey | 204/298 |

Primary Examiner—Arthur P. Demers
Attorney, Agent, or Firm—Antonelli, Terry & Wands

[57] ABSTRACT

The invention is directed to a dry-etching apparatus used for etching an aluminum wiring film formed on a wafer, and more particularly to a dry-etching apparatus which can remove chlorides deposited on the surface of the wafer during the dry etching thereof, as well as an etching resist film, without having to take the wafer out. This dry-etching apparatus is provided with an etching chamber, a vacuum antechamber attached to the etching chamber by a gate valve, and a post-treatment chamber attached to the vacuum antechamber. The apparatus is so formed that etched wafers removed to the vacuum antechamber can be sent therefrom to the post-treatment chamber, and then the post-treated wafers can be removed to the vacuum antechamber again, and then removed therefrom to the atmosphere.

2 Claims, 4 Drawing Figures

DRY-ETCHING APPARATUS

BACKGROUND OF THE INVENTION

This invention relates to a dry-etching apparatus which can etch aluminum wiring films on wafers of integrated circuit elements, and can provide a post-treatment in which etching resist films are removed together with the chlorides deposited on the surface of the wafers during the etching process.

A dry-etching apparatus with a parallel, flat electrode system provided with vacuum antechambers before and after an etching chamber has been proposed as a dry-etching apparatus for the etching of the aluminum wiring films formed of wafers of integrated circuit elements.

One side of this dry-etching apparatus is provided with a first vacuum antechamber in which a wafer-feed unit holding therein a cassette containing a plurality of wafers, and the other side thereof is provided with a second vacuum antechamber in which a recovery unit holding therein a cassette containing a plurality of etched wafer. Shutters are provided at the entrances and exit of the vacuum antechambers, and between the vacuum antechambers and an etching chamber. Each of the vacuum antechambers is provided with an internal transfer means by which the wafers are transferred from the feed unit to the etching chamber, and then to the recovery unit therefrom.

In such a dry-etching apparatus, a cassette containing wafers is held in the feed unit, and an empty cassette in the recovery unit, and the vacuum antechambers are then evacuated in such a manner that the pressure in the vacuum antechambers is lower than that in the etching chamber. The shutter between the first vacuum antechamber and the etching chamber is then opened so that a wafer can be removed from the cassette in the wafer feed unit, and the wafer is supplied to the etching chamber. The shutter is then closed and the etching of the wafer performed. When the etching is completed, the shutter between the etching chamber and the second vacuum antechamber is opened so that the etched wafer can be removed from the etching chamber and stored in the cassette in the recovery unit. When the etching of a required number of wafers is completed, and the etched wafers have been stored in the cassette, the shutter at the exit of the second vacuum antechamber is opened, and the cassette is removed therefrom and sent on to a post-treatment stage. In the post-treatment stage, chlorides deposited on the surface of the wafers and the etching resist films are removed in a plasma atmosphere using oxygen as a reaction gas.

This dry-etching apparatus, in which the etched wafers is removed into the atmosphere, has the following problems.

In the regular dry etching of aluminum, a chloride gas, such as carbon tetrachloride or boron tetrachloride, is used as the etching reaction gas. When etching is done with such a gas, chlorides are deposited on the wafers and the resist films formed thereon. These chlorides have an extremely high hydroscopicity. Accordingly, when the chlorides come into contact with the atmosphere, they absorb the water contained therein and dissolve, so that chlorine ions are generated. The chlorine ions react with the aluminum to dissolve it, which results in breaks in the wiring of the integrated circuit elements.

SUMMARY OF THE INVENTION

An object of the present invention is to provide a dry-etching apparatus which can supply dry-etched wafers to a post-treatment stage without removing them into the atmosphere.

In order to achieve this object, the dry-etching apparatus according to the present invention is provided with a post-treatment chamber in a vacuum antechamber attached to an etching chamber, so that the wafers recovered from the etching chamber can be removed into the atmosphere via the post-treatment chamber.

DESCRIPTION OF THE PREFERRED EMBODIMENT

Figure 1:
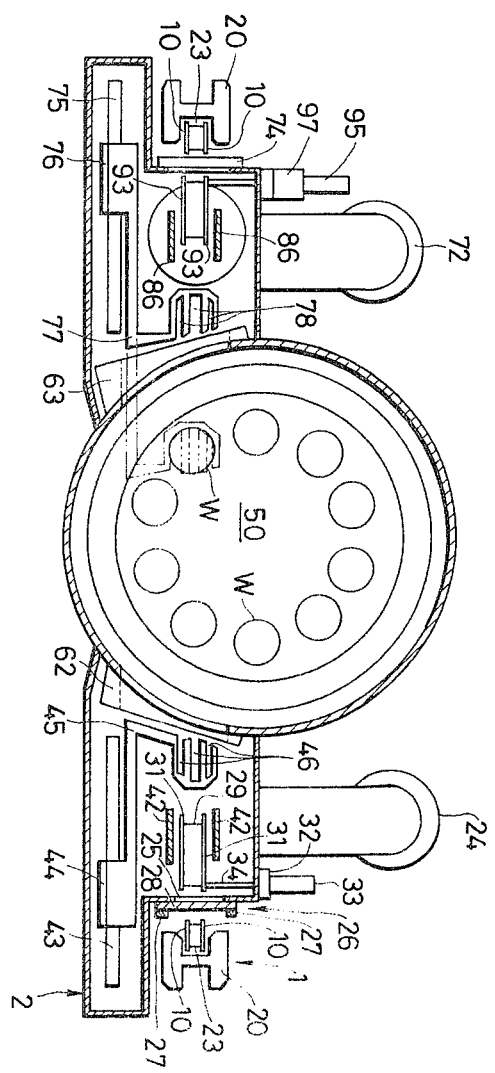
FIG. 1 is a sectioned plan view of the dry-etching apparatus according to the present invention.
Figure 2:
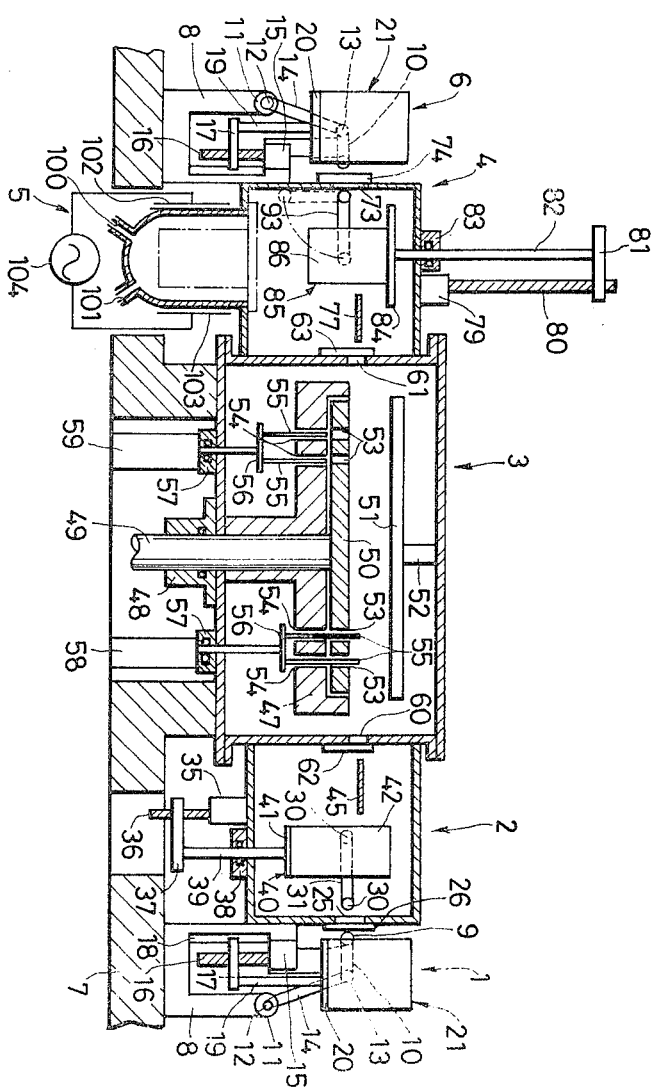
FIG. 2 is a sectioned front elevation of the apparatus of FIG. 1.
Figure 3:
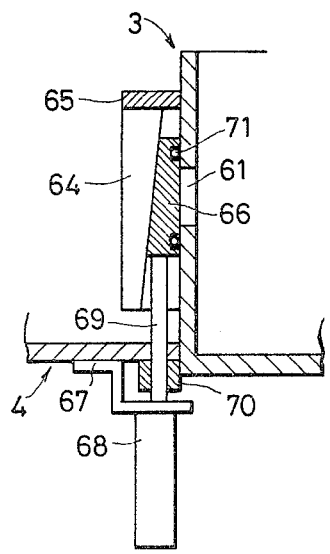
FIG. 3 is an enlarged view of the gate valve of FIG. 2.

An embodiment of the present invention will now be described with reference to the drawings.

FIGS. 1-4 show a dry-etching apparatus according to the present invention. This dry-etching apparatus is provided with a wafer-feed means 1, a first vacuum antechamber 2 which receives a wafer from the feed means 1 and places the wafer in a vacuum atmosphere, an etching chamber 3 which receives the wafer from the first vacuum antechamber 2 and etches it, a second vacuum antechamber 4 which takes the etched wafer from the etching chamber 3 and holds it therein, a post-treatment chamber 5 formed in a lower portion of the second vacuum antechamber 4 which removes chlorides deposited on the surface of the etched wafer, as well as the etching resist film, and a recovery means 6 positioned opposite the second antechamber 4 which receives the post-treated wafer discharged from the second vacuum antechamber 4.

The feed means 1 is held on a support member 8 attached to a base 7. A plate (not shown) is attached to the upper end of the support member 8, and shafts (not shown) are supported rotatably at both ends thereof. Pulleys 9 are fixed on either end of these shafts, and belts 10 are passed around the pulleys 9. A motor 11 is held on the support member 8, and a pulley 12 is fixed onto a rotary shaft thereof. A belt 14 is passed around the pulley 12 and a pulley 13 fixed onto one end of one of the above-mentioned shaft (not shown). Accordingly, when the motor 11 is started, the belt 14 rotates. Another motor 15 is held on the support member 8, and a feed screw 16 is connected to a rotary shaft of this motor 15. One end of a lift plate 17 provided with a female thread meshed with the feed screw 16 fits slidably in a guide 18 attached to the support member 8. Accordingly, when the motor 15 is started, the lift plate 17 moves vertically along the guide 18. A support post 19 is set up on the lift plate 17, and a wafer-containing cassette 21 is provided on a base 20 attached to the upper end of the support post 19. The cassette 21 consists of a pair of side plates 22 positioned on either side of the belts 10, and a plate connecting the upper ends of the side plates 22 together. Each of the facing surfaces of the side plates 21 is provided with a plurality of wafer-supporting grooves. The base 20 is provided with a groove 23 through which the belts 10 can move. When the base 20 is moved downward, the belts 10 can enter the cassette 21 through the groove 23.

When the base 20 is in the uppermost position within its range of vertical movement, the cassette 21 containing a required number of wafers is placed on the base 20. The motor 15 is then started so that it lowers the base 20 and the cassette 21. When the lowermost of the plurality of wafers held in the cassette 21 is positioned on the belts 10 entering the cassette 21, the motor 15 is stopped. When the motor 11 is then started to turn the belts 10, the wafer thereon is carried out of the cassette 21 by the belts 10 and is transferred to a subsequent position. The wafers in the cassette 21 can thus be removed in order and transferred to the subsequent position.

The first vacuum antechamber 2 is attached to and supported on the etching chamber 3. The first vacuum antechamber 2 is attached removably to a vacuum source 24, which generates a pressure lower than the pressure (normally $10^{-1}$–$10^{-2}$ Torr) in the etching chamber 3 (for example, less than $10^{-3}$ Torr). A gate valve 26 is provided in an entrance 25 of the first vacuum antechamber 2. The gate valve 26 is provided with a pair of guides 27 attached to the outer wall of the first vacuum antechamber 2 so as to face each other on either side of the entrance 25, a valve 28 guided slidably by the guides 27, and a cylinder (not shown) positioned below the valve 28 to move it vertically. An O-ring (not shown) is provided on the surface of the valve 28 which is opposite to the first vacuum antechamber 2. When the valve 28 is pressed against the first vacuum antechamber 2, the O-ring comes into contact with the surface of the wall thereof to hermetically seal the entrance 25. The guides 27 are designed so that a guide portion of the valve 28, which is formed by the guides 27 and the wall surface of the first vacuum antechamber 2, converges upward. When the valve 28 moves upward, the O-ring mounted on the valve 28 is pressed against the wall surface of the first vacuum antechamber 2. Accordingly, when the first vacuum antechamber 2 is connected to the vacuum source 24 after the entrance 25 thereof has been sealed with the valve 28, the antechamber 2 is evacuated so that the pressure therein is reduced to less than $10^{-3}$ Torr. In order to open the entrance 25, the vacuum source 24 and the first vacuum antechamber 2 are first disconnected from each other. A plate 29 is attached to a predetermined position in the first vacuum antechamber 2. The plate 29 is provided with shafts (not shown) supported rotatably at both ends thereof. Pulleys 30 are fixed at each end of these shafts, and belts 31 are passed around the pulleys 30. One of these shafts is connected to a rotary shaft 34 projecting from a motor 33 which is attached to a side surface of the first vacuum antechamber 2 via a seal member 32, into the interior of the antechamber 2 through the seal member 32 and the side wall of the antechamber 2. Therefore, when the motor 33 is started, the belts 31 rotated. A motor 35 is supported on the lower surface of the first vacuum antechamber 2, and a feed screw 36 is connected to a rotary shaft thereof. A lift plate 37 provided with a female thread meshing with the feed screw 36 is provided with a support post 39 extending at right angles thereto so that it can slide through the lower wall of the first vacuum antechamber 2 and a seal chamber 38 attached thereto. A cassette 40 holding wafers therein is supported on the upper end of the post 39.

Accordingly, when the motor 35 is started, the cassette 40 moves upward. The cassette 40 is provided with a base plate 41 connected to the support post 39, and a pair of side plates 42 erected on the base plate 41 in such a manner that the side plates 42 face each other on either side of the belts 31. The opposite inner surfaces of each of the side plates 42 is provided with a plurality of wafer-holding grooves. Therefore, when a wafer is transferred by the belts 31 so that it is inserted into the grooves in the side plates 42, it can be held in the cassette 40. A guide 43 and a slider 44, which are part of a linear motor, are provided in the first antechamber 2. An arm 45 is supported on the slider 44. Accordingly, when the slider 44 moves, the arm 45 also moves. A free end of the arm 45 has such a size that it can enter the space between the side plates of the cassette 40. The free end of the arm 45 is provided with grooves 46, and is positioned higher than the belts 31 to prevent it colliding with them.

In this arrangement, the valve 28 is lowered to open the entrance 25 after the first vacuum antechamber 2 and the vacuum source 24 have been disconnected from each other. The wafer removed from the cassette 21 by the belts 10 of the feed means 1 is sent through the entrance 25 into the first vacuum antechamber 2 and is then placed on the belts 31. The belts 10, 31 are positioned in such a manner that the distance between the belts 10, 31 is at most half of the external dimensions of the wafer. When the belts 31 move, the wafer is transferred from the belts 10 thereonto, and the wafer is then carried into the cassette 40. When the wafer has reached the center of the interior of the cassette 40, the belts 31 are stopped and the motor 35 started. Consequently, the cassette 40 is moved upward to push the wafer upward to remove it from the belts 31. Wafers held in the cassette 21 are thus transferred to the cassette 40 in order. When a required number of wafers have been transferred to the cassette 40, the valve 28 is moved up to seal the entrance 25. The first vacuum antechamber 2 is then connected to the vacuum supply source 24 to evacuate the interior thereof. When the pressure in the first vacuum antechamber 2 has reached a predetermined level, the etching chamber 3 opens, and the slider 44 is actuated so that the free end of the arm 45 can enter the cassette 40. When the cassette 40 is then lowered, a wafer held therein is placed on the arm 45. The slider 44 is actuated to transfer the arm 45 into the etching chamber 3, with this wafer carried on the arm 45.

The etching chamber 3 is supported on the base 7 and is connected to a vacuum source (not shown) by a discharge port (not shown). The etching chamber 3 is also connected to a reaction gas source (not shown) by a reaction gas supply port (not shown). A cover 47 preventing the occurrence of abnormal discharge is fixed in the etching chamber 3. A lower electrode 50 is attached to the upper end of a shaft 49 which extends rotatably through a seal member 48 attached to the lower surface of the etching chamber 3, and the cover 47. The lower end of the shaft 49 is connected to a motor (not shown). When this motor is started, the lower electrode 50 is indexed and continues to rotate. An upper electrode 51 facing the lower electrode 50 is attached to the upper wall of the etching chamber 3 by a support post 52. The lower and upper electrodes 50, 51 are connected to a power source (not shown). A plurality of holes 53 are formed in each of portions of the lower electrode 50 in which wafers are placed. A plurality of holes 54 communicating with the holes 53 are formed in portions of the cover 47 which correspond to wafer-feed positions and wafer-recovery positions. A plurality of pins 55 extending slidably through the holes 53, 54 are supported on a pair of plates 56 positioned below the cover 47. The plates 56 are attached to rods which project from cylinders 58, 59 supported under the lower surface of the etching chamber 3 through seal members 57, and which can slide through the seal members 57. Accordingly, when the cylinders 58, 59 are actuated, the pins 55 are moved reciprocatingly in such a manner that the free ends of the pins 55 are displaced between standby positions in the holes 54 in the cover 47 and transfer positions slightly above the upper surface of the lower electrode 50 on which the wafers are placed. The side walls of the etching chamber 3 is provided with an entrance 60 through which the wafers are supplied and an exit 61 from which the wafers are discharged. Gate valves 62, 63 are provided in the entrance 60 and exit 61, respectively. The gate valve 62, 63 are formed in the same manner as the gate valve 26 in the first vacuum antechamber 2. The gate valve 63, shown in FIG. 3 as an example of these gate valves, will now be described. The outer surface of the side wall of the etching chamber 3 is provided with a pair of guides 64 attached thereto in such a manner that the guides 64 face each other with the exit 61 therebetween, a plate 65 attached to the portion of the outer surface which is above the exit 60 so as to connect the guides 64 together, a valve 66 guided slidably by the guides 64, and a cylinder 68 which is supported on a holder 67 attached to the lower surface of the second vacuum antechamber 4 so as to be positioned below the valve 66. A rod 69 in the cylinder 68 extends slidably through a seal member 70 attached to the lower surface of the second vacuum antechamber 4 and is attached to the valve 66 in the antechamber 4. An O-ring 71 is provided on the surface of the valve 66 which faces the etching chamber 3. When the valve 66 is pressed against the etching chamber 3, the O-ring 71 comes into contact with the outer surface thereof to hermetically seal the exit 61. The guides 64 are so designed that a guide passage, formed between the guides 64 and the wall surface of the etching chamber 3, in the valve 66 converges upward. When the valve 66 moves upward, it is displaced toward the etching chamber 3 to press the O-ring 71 provided on the valve 66 against the outer surface of the etching chamber 3. Therefore, when the cylinder 68 is actuated to press the valve 66 upward, the exit 61 can be hermetically sealed.

In this arrangement, wafers are placed in the cassette 40 in the first vacuum antechamber 2, and the pressure in the antechamber 2 is reduced to less than that in the etching chamber 3. The gate valve 62 is then actuated to open the entrance 60. A wafer removed from the cassette 40 is sent through the entrance 60 of the etching chamber 3 to a feed position on the lower electrode 50 by the arm 45 in the first vacuum antechamber 2, and the cylinder 58 is actuated to press the pins 55 upward. The pins 55 thus project from the lower electrode 50 to extend through the grooves 46 in the arm 45 and push the wafer upward to remove it from the arm. When the arm 45 is then transferred to the first vacuum antechamber 2, the wafer is left on the pins 55. The cylinder 58 is then actuated to lower the pins 55. When the free ends of the pins 55 have entered the holes 53 in the lower electrode 50, the wafer is placed on the upper surface of the lower electrode 50. When the pins 55 have returned to their standby position, the lower electrode 50 is indexed through a predetermined angle to that the subsequent wafer can be supplied. The wafers are thus supplied from the cassette 40 in the first vacuum antechamber 2 to the lower electrode 50 in the etching chamber 3. During this time, the pressure in the first vacuum antechamber 2 is lower than that in the etching chamber 3, so that an air current flowing from the etching chamber to the antechamber occurs. Accordingly, even when there are contaminants in the first vacuum antechamber 2, they do not flow into the etching chamber 3. The degree of vacuum in the etching chamber 3 becomes higher than that required for the etching of the wafers, so that the etching can start immediately the entrance 60 is closed. When a predetermined number of wafers has been supplied to the lower electrode 50, the gate valve 62 is actuated to close the entrance 60. A predetermined voltage is then applied between the lower and upper electrodes 50, 51 while the reaction gas is supplied to the etching chamber 3 at a predetermined pressure and flow rate, with the chamber 3 evacuate, so that the etching can be performed. The lower electrode 50 is rotated during this time so that the plurality of wafers can be etched uniformly. When the etching has been completed, the supply of the reaction gas, the application of voltage and the rotation of lower electrode 50 are stopped, and the etching chamber is evacuated to a predetermined pressure. The gate valve 63 is then actuated to open the exit 61. The cylinder 69 is then actuated to move the pins 55 from their standby position to the transfer position to push a wafer upward from the lower electrode 50 to the transfer position. The wafer is removed from the etching chamber rapidly.

Figure 4:
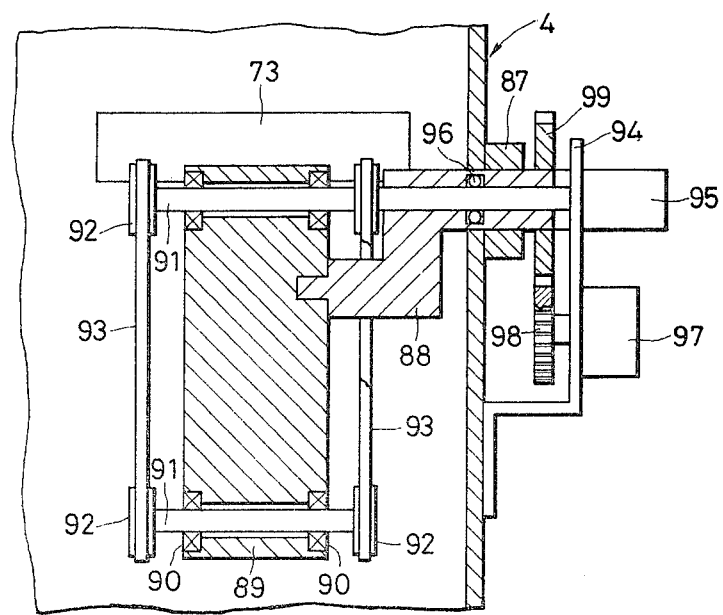
FIG. 4 is an enlarged view of the discharge belt of FIG. 2.

The second vacuum antechamber 4 is attached to and supported by the etching chamber 3. The second vacuum antechamber 4 is attached removably to a vacuum source 72 which generates a pressure equal to that in the first vacuum antechamber 2. An exit 73 of the second vacuum antechamber 4 is provided with a gate valve 74 of the same construction as that of the gate valves 26, 62, 63 (a detailed description of the gate valve 74 will thus be omitted). The second vacuum antechamber 4 is also provided with a guide and a slider 76 which are part of a linear motor. The slider 76 has an arm 77 supported thereon, when the slider 76 is actuated, the arm 77 move reciprocally between a transfer position in the etching chamber 3 and a wafer-holding position in the second vacuum antechamber 4. The arm 77 is normally in a standby position which is halfway between the wafer-holding position and the gate valve 63. The free end of the arm 77 is provided with grooves 78 in which the pins 55 provided in the etching chamber 3 can fit slidably. A motor 79 is supported on the upper surface of the second vacuum antechamber 4. A feed screw 80 is connected to a rotary shaft of the motor 79, and a support post 82 is erected on a lift plate 81 provided with a female thread meshing with the feed screw 80. The support post 82 extends slidably through a seal member 83 attached to the upper surface of the second vacuum antechamber 4, and projects into the interior thereof. A cover 84 closing an entrance of the post-treatment chamber 5 is supported on the lower end of the support post 82 which projects into the interior of the second vacuum antechamber 4. A cassette 85 for holdings the etched wafers is secured to the lower surface of the cover 84. The cassette 85 is provided with a pair of side plates 86 which extend from the lower surface of the cover 84 at right angles thereto, and which face other at a predetermined distance on either side of the position in which the wafers removed from the etching chamber 3 are received for storage. The surfaces of the side plates 86 which face each other are provided with grooves for holding the wafers. As shown in FIG. 4, a plate 89 supported on a crank shaft 88 extending rotatably through a seal member 87, which is attached to the rear surface of the second vacuum antechamber 4, is provided on the inner side of the exit 73 of the antechamber 4. Shafts 91 are supported rotatably by bearings at either end of the plate 89. Pulleys 92 are fixed on both ends of each of the shafts 91, and belts 93 are passed around the pulleys 92. A motor 95 is supported on a support member 94 secured to the rear surface of the second vacuum antechamber 4. A rotary shaft of the motor 95 extends rotatably through part of the shaft 88 so that it projects into the interior of the second vacuum antechamber 4 and is attached to one of the shafts 91. The portions of the shaft 88 and the rotary shaft of the motor 95 which pass through the rear wall of the chamber 4 are hermetically sealed by a seal member 96. A rotary actuator 97 is also supported on the support member 94. A gear 98 attached to an output shaft of the rotary actuator 97 meshes with a gear 99 fixed on one end of the shaft 88. Accordingly, when the rotary actuator 97 is started to turn the shaft 88, one end of the plate 89 is pivoted about the shaft 91 provided at the other end of the plate 89, and which is attached to the rotary shaft of the motor 95, between a standby position away from a passage in which the cover 84 moves vertically, and a wafer-recovery position in which the plate 89 enters the interior of the cassette 85. When the motor 95 is started, the belts 93 rotate.

In this arrangement, the gate valve 63 is actuated after the etching of the wafers has been completed, to open the exit 61 of the etching chamber 3. When the cylinder 59 is actuated to make the pins 55 push a wafer upward to the wafer-transfer position, the slider 76 is actuated to move the free end of the arm 77 to the transfer position. The grooves 78 in the free end of the arm 77 then engage with the pins 55 so that the arm 77 is inserted into the space under the wafer raised by the pins 55. When the cylinder 59 is then actuated to lower the pins 55 to their standby position, the wafer which had been raised thereby is placed on the arm 77. When the slider 76 is actuated to transfer the arm 77 from the etching chamber 3 to the second vacuum antechamber 4, the wafer on the arm 77 is carried from the etching chamber to the antechamber through the exit 61. When the arm 77 is further moved as for as the wafer-storage position in the cassette 85, the wafer is stored thereat. When the motor 79 is actuated after the arm 77 has stopped, to lift the cassette 85, the wafer is removed from the arm 77. The arm 77 is then moved back into the etching chamber 3 to remove the next wafer therefrom. When all of the etched wafers have been removed and placed in the cassette 85, the arm 77 returns to its standby position and stops there. In order to discharge the wafers held in the cassette 85 out of the second vacuum antechamber 4, the following procedure is followed. First, the gate valve 74 is actuated to open the exit 73. The rotary actuator 97 move the plate 89 to the wafer-recovery position, and the motor 95 rotates the belts 93. The motor 79 is then started to lower the cassette 85 holding the wafers, so that the lowermost of the wafers in the cassette 85 is transferred onto the moving belts 93. The wafer is transferred by the belts 93 to the exit 73, from which the wafer is sent out to the exterior of the second vacuum antechamber 4.

The recovery of the etched wafer from the etching chamber 3 and the discharge of the post-treated wafers from the second vacuum antechamber 4 can be done in this manner.

The post-treatment chamber 5 consists mainly of a cylindrical vessel secured to the lower surface of the second vacuum antechamber 4. This chamber 5 is provided with a reaction gas supply port 100 and a reaction gas discharge port 101 which are connected to a reaction gas source (not shown) and a vacuum source (not shown) for evacuating the post-treatment chamber 5, respectively. Electrodes 102, 103 for supplying post-treatment energy are formed to be semi-cylindrical and are positioned on the outside of the cylindrical vessel, the electrodes 102, 103 being connected to a power source 104.

In this arrangement, the motor 79 is started with wafers held in the cassette 85 in the second vacuum antechamber 4, to lower the cassette 85 until the cover 84 comes into contact with the lower surface of the antechamber 4. As a result, the cassette 85 is inserted into the post-treatment chamber 5. A high-frequency voltage is applied to the electrodes 102, 103 while oxygen, which is used as the reaction gas, is supplied to and discharged from the post-treatment chamber 5. When the post-treatment is completed, the supply of the reaction gas and the application of the voltage are stopped, and the reaction gas is discharged from the post-treatment chamber 5. The motor 79 then lifts the cassette 85. The lower surface of the cover 84 is provided with a seal member (not shown), such as an O-ring.

Since the recovery means 6 has the same construction as the feed means 1, the parts thereof are designated by the same reference numerals. The belts 10, 93 are positioned so that the distance between them is at most half of the eternal dimension of a wafer.

With this arrangement, the etching chamber 3, second vacuum antechamber 4 and post-treatment chamber 5 are first evacuated to predetermined pressures. The first vacuum antechamber 2 is disconnected from the vacuum source 24, and the gate valve 26 is actuated to open the entrance 25. The base 20 of the feed means 1 is moved to the uppermost position of its range of movement by the motor 15. The cassette 21 containing a plurality of wafers is placed on the base 20. Meanwhile, the cassette 40 in the second vacuum antechamber 2 is moved to the lowermost position of its range of movement by the motor 35. The motors 11, 33 then rotate the belts 10, 31. When the motor 15 is started to lower the cassette 21, the lowermost wafer therein is transferred onto the belts 10. When this wafer has been placed on the belts 10 and moved out of the grooves in the cassette 21, the motor 15 is stopped, and the wafer is carried out of the cassette 21 by the belts 10. The wafer carried by the belts 10 is sent through the entrance 25 into the interior of the first vacuum antechamber 2. Consequently, the front end of the wafer moves onto the belts 31, so that the wafer is transferred from the belts 10 to the belts 31. The wafer transferred to the belts 31 is sent thereby into the cassette 40. When the belts 31 are stopped temporarily, the motor 35 is started to lift the cassette 40 one pitch to insert the wafer on the belts 31 into the cassette 40. When all the wafers in the cassette 21 have thus been transferred to the cassette 40, the gate valve 26 is actuated to close the entrance 25 of the first vacuum antechamber 2. As a result, the antechamber 2 is connected to the vacuum source 24, so that the atmosphere which has entered the antechamber is discharged therefrom. When the pressure in the first vacuum antechamber 2 is lower than that in the etching chamber 3, the gate valve 62 provided therebetween is actuated to open the entrance 60. Consequently, the slider 44 is actuated to move the arm 45 its standby position to its wafer-holding position in the cassette 40. When the motor 35 is then actuated to lower the cassette 40 one pitch, the lowermost wafer therein moves onto the arm 45. The slider 44 is then moved toward the etching chamber 3, and the wafer supported on the arm 45 is carried through the entrance 60 to the transfer position above the lower electrode 50 in the etching chamber 3. As a result, the cylinder 58 is actuated to lift the pins 55 to push up the wafer carried thereto by the arm 45, and thereby remove the wafer therefrom. The arm 45 then returns to the first vacuum antechamber 2 to remove the next wafer. The cylinder 58 is actuated to lower the pins 55, and a wafer W is placed on the upper surface of the lower electrode 50. The lower electrode 50 is indexed through one pitch. When the required number of wafers W (10 in the embodiment shown in FIG. 1) have thus been distributed onto the upper surface of the lower electrode 50, the gate valve 62 is actuated to close the entrance 60. The etching reaction gas is then supplied to and discharged from the etching chamber 3, and a voltage is applied between the lower and upper electrodes 50, 51, to etch the wafers W. When the etching is completed, the supply of the reaction gas and the application of the voltage are stopped, and the etching chamber 3 is evacuated until the pressure therein reaches a predetermined level. The gate valve 63 is then actuated to open the exit 61 of the etching chamber 3 and, at the same time, the cylinder 59 is actuated to lift the pins 55, so that a wafer W is moved from the lower electrode 50 to the transfer position. The slider 76 is then actuated to move the arm 77 from the exit 61 into the etching chamber 3 so that the free end of the arm 77 is inserted between the wafer W in the transfer position and the lower electrode 50. The cylinder 59 is then actuated to return the pins 55 to the standby position. Consequently, the wafer W supported on the pins 55 is placed on the arm 77. When the slider 76 then moves toward the recovery means 6, the wafer W supported on the arm 77 is transferred to the second vacuum antechamber 4 through the exit 61. As the arm 77 moves further, the wafer W reaches its storage position in the cassette 85 in the second vacuum antechamber 4. The arm 77 is then stopped, and the motor 79 is started to lift the cassette 85 one pitch, so that the wafer is placed in the cassette 85 and is removed from the arm 77. The slider 76 is then actuated to move the arm 77 into the etching chamber 3 to remove the next wafer therefrom. When all of the etched wafers have thus been stored in the cassette 85, the gate valve 63 is actuated to close the exit 61. Meanwhile, the arm 77 is stopped at its standby position. The motor 79 is then started to lower the cassette 85 and insert it into the post-treatment chamber 5. When the entrance of the post-treatment chamber 5 has been closed with the cover 84, the motor 79 is stopped. When the post-treatment chamber 5 has been sealed by the cover 84, the reaction gas for post-treating the wafers is supplied from the supply port 100 thereto and discharged from the discharge port 101, and a voltage is applied at the same time from the power source to the electrodes 102, 103. The resist films formed on the wafers and the chlorides deposited on the wafers are removed by the plasma generated in the post-treatment chamber 5.

When the post-treatment is completed, the supply of the reaction gas and the application of the voltage are stopped, and the post-treatment chamber 5 is evacuated until the pressure therein has reached a predetermined level. After the second vacuum antechamber 4 and the vacuum source 72 have been disconnected from each other, the motor 79 is started to lift the cover 84 and the cassette 85. The rotary actuator 97 then transfers the plate 89 to the recovery position within the cassette 85, and the motor 95 is started to rotate the belts 93. The gate valve 74 is then actuated to open the exit of the second vacuum antechamber 4. The motor 11 for the recovery means 6 then rotates the belts 10, and the motor 79 is started to lower the cassette 85 one pitch. As a result, the lowermost wafer in the cassette 85 moves onto the belts 93 and is removed from the cassette 85 by the movement of the belts 93. After the wafer has been removed from the second vacuum antechamber 4 through the exit 73, it moves onto the belts 10 of the recovery means 6 so that the wafer is transferred from the belts 93 to the belts 10. When the wafer has been transferred by the belts 10 into the interior of the cassette 21 in the recovery means 6, the belts 10 are stopped. The motor 15 in the recovery means 6 is then started to lift the cassette 21 one pitch, the wafer is raised by the cassette 21 so that it is removed from the belts 10 and is placed in the cassette 21. All the wafers held in the cassette 85 in the second vacuum antechamber 4 are thus transferred to the cassette 21 in the recovery means 6, and the gate valve 74 is then actuated to close the exit 73. The second vacuum antechamber 4 and the vacuum source 72 are then connected together so that the antechamber 4 is evacuated, and meanwhile the cassette 21 in the recovery means 6 is sent onto the next stage.

The etching and post-treatment of the wafers can be done in this manner.

This embodiment has been described in accordance with the movements of the wafers. Since the treatment time during etching is comparatively long, the next batch of wafers may be supplied from the feed means to the interior of the first vacuum antechamber 2 during the etching of the preceding batch of wafers. In the same way, a preceding batch of etched wafers may be subjected to the post-treatment and removed from the second vacuum antechamber 4 to the recovery means 6 during the etching of the subsequent batch of wafers. In addition, the supply and recovery of wafers to and from the etching chamber 3 can be done simultaneously.

The feed means 1 and the first vacuum antechamber 2 in the above embodiment need not be used: the recovery means 6 may be so designed that it can also act as a feed means, so that the wafers can be supplied and recovered by the same means 6.

We claim:

1. In a dry-etching apparatus provided with an etching chamber within which the dry etching of an aluminum wiring film formed on a wafer is performed, a vacuum antechamber in which the degree of vacuum is higher than that in said etching chamber, a gate valve provided in an opening made in a boundary wall between said etching chamber and said antechamber, a dry-etching apparatus characterized in that it is provided with a cassette in said vacuum antechamber which is adapted to hold a wafer in such a manner that the wafer can be inserted thereinto and removed therefrom, a transfer means supporting said cassette and which is adapted to move said cassette reciprocally between a wafer-holding position in which said wafer can be inserted into and removed from said cassette, and an post-treatment position in which the etched wafer is subjected to post-treatment, and a post-treatment chamber provided at said post-treatment position so as to communicate with said vacuum antechamber.

2. The dry-etching apparatus according to claim 1, wherein said vacuum antechamber is provided therein with an arm for transferring said wafer between said vacuum antechamber and said etching chamber, and a linear motor for moving said arm.

* * * * *